(12) United States Patent
Salfelner

(10) Patent No.: US 7,403,079 B2
(45) Date of Patent: Jul. 22, 2008

(54) FREQUENCY MODULATOR AND FREQUENCY MODULATION METHOD

(75) Inventor: Anton Salfelner, Pernegg (AT)

(73) Assignee: Infineon Technologies AG, Munich (DE)

( * ) Notice: Subject to any disclaimer, the term of this patent is extended or adjusted under 35 U.S.C. 154(b) by 592 days.

(21) Appl. No.: 11/143,855

(22) Filed: Jun. 2, 2005

(65) Prior Publication Data

US 2006/0018405 A1 Jan. 26, 2006

(30) Foreign Application Priority Data

Jun. 3, 2004 (DE) .................... 10 2004 027 184

(51) Int. Cl.
*H03C 3/00* (2006.01)

(52) U.S. Cl. .................. 332/117; 322/144; 322/119; 455/102; 455/112; 455/110

(58) Field of Classification Search ................ 332/117, 332/119, 144; 455/102, 110, 112
See application file for complete search history.

(56) References Cited

U.S. PATENT DOCUMENTS 4,503,405 A * 3/1985 Jordan et al. ................ 332/123
6,225,864 B1 * 5/2001 Luu ............................ 330/10

FOREIGN PATENT DOCUMENTS

DE 31 13 800 3/1982

OTHER PUBLICATIONS

R. Köstner et al., "Elektronische Schaltungen," Carl Hanser, Verlag München Wien, pp. 246-247 (1993). (Translation provided).

* cited by examiner

*Primary Examiner*—Arnold Kinkead
(74) *Attorney, Agent, or Firm*—Dicke, Billig & Czaja, PLLC

(57) ABSTRACT

A frequency modulation method is provided in which the frequency of a carrier signal is modulated on the basis of the frequency of a modulation signal, and in which the modulation signal is integrated. The carrier signal is integrated, and a differential signal is formed from the integrated modulation signal and the integrated carrier signal. The differential signal is phase-modulated in order to obtain the frequency-modulated carrier signal as the output signal.

20 Claims, 8 Drawing Sheets

FREQUENCY MODULATOR AND FREQUENCY MODULATION METHOD

CROSS-REFERENCE TO RELATED APPLICATIONS

This Utility patent application claims priority to German Patent Application No. DE 10 2004 027 184.4, filed on Jun. 3, 2004, which is incorporated herein by reference.

BACKGROUND

The invention relates to a frequency modulator and to a frequency modulation method.

A frequency modulator 101 as illustrated in FIG. 8 is known from the prior art.

This frequency modulator 101, which is implemented, for example, in the RKE transmitter families TDx51xx and TDA525x as well as PMA5100 of Infineon Technologies AG, Munich, comprises a crystal oscillator 102, a phase locked loop 106 and an electronic switch S which can be opened and closed in time with a modulation signal $M_E$ that is applied to an input $E_M$.

An input of the crystal oscillator 102 is connected to ground via the series connection of a crystal Q to a series circuit comprising two capacitors $C_1$, $C_2$. The switch S is arranged parallel to one of these capacitors $C_1$, $C_2$ (namely $C_1$) in such a manner that it bridges the latter when the switch S is closed.

In the case of a frequency modulator 101 of this type, a frequency-modulated signal which can be tapped off at an output A and can be emitted by an antenna 107 is frequency-modulated by frequency-modulating the reference frequency of the phase locked loop 106. The reference signal for the phase locked loop (PLL) 106 is provided by the crystal oscillator 102 which is frequency-modulated by changing the series capacitance $C_S$ of the crystal Q, said series capacitance being formed by the individual capacitances $C_1$, $C_2$.

When the switch S is open, the series capacitance $C_S = C_1 \times C_2/(C_1+C_2)$ is small, with the result that the oscillator frequency is high. When the switch S is closed, the series capacitance $C_S = C_2$ is large, with the result that the oscillator frequency is low.

The disadvantage of a frequency modulator of this type is that the data rate of the modulation signal is limited on account of transient processes when closing and opening the switch S.

Only small frequency shifts $\Delta\omega$ are possible since the oscillation frequency of a crystal can be changed only to a slight extent. Since the oscillation frequency of the crystal oscillator must be designed to be variable in the case of a frequency modulator of the type described above, this results in the crystal oscillator having an associated low frequency stability. Finally, there is no shift flexibility whatsoever. In addition, no baseband filtering is possible.

The prior art also discloses using a system having direct digital synthesis (DDS) as the frequency modulator. Frequency modulators of this type are extremely complex and have only low efficiency. Only a frequency-modulated signal having a high parasitic oscillation component can be generated using currently available systems.

So-called IQ modulators are furthermore provided in the transmission path. However, IQ modulators of this type are likewise very complex and have low efficiency.

SUMMARY

One embodiment of the invention presents a low-power frequency modulator which can be implemented in a simple manner, and a simple frequency modulation method. A frequency modulation method is provided in which the frequency of a carrier signal is modulated on the basis of the frequency of a modulation signal, and in which the modulation signal is integrated. The carrier signal is integrated, and a differential signal is formed from the integrated modulation signal and the integrated carrier signal. The differential signal is phase-modulated in order to obtain the frequency-modulated carrier signal as the output signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 8:
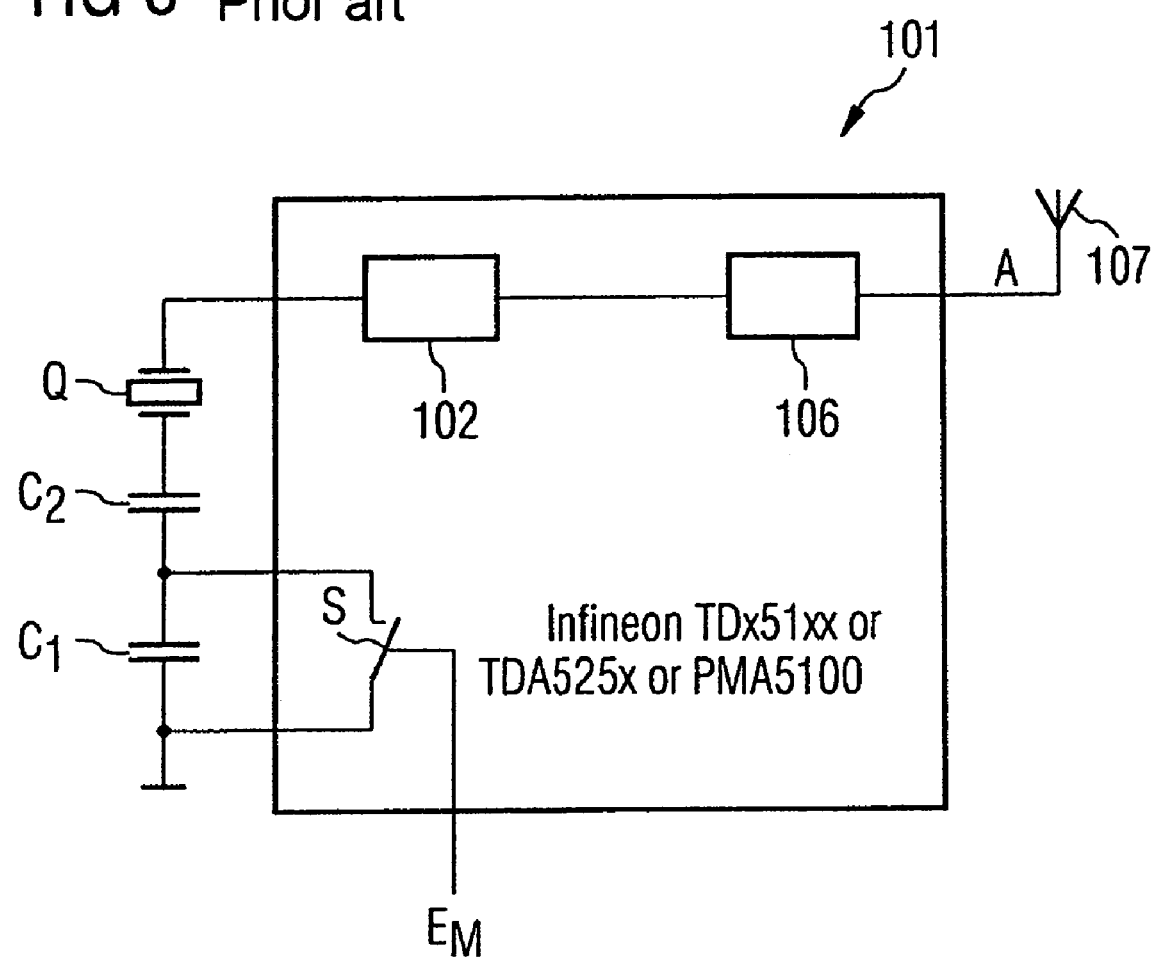
FIG. 8 illustrates a frequency generator in accordance with the prior art.

One embodiment of the invention achieves frequency modulation—as in the case of a frequency modulator illustrated in FIG. 8 and described above using a fixed carrier oscillator and a downstream phase modulator. Since phase modulation mathematically represents the integral of frequency modulation, the modulation signal is integrated at the input of the phase modulator. Details of this can be found, for example, in Köstner, R.; Möschwitzer, A.: "Elektronische Schaltungen" [Electronic Circuits], Carl Hanser Verlag Munich, Vienna, 1993, ISBN 3-446-16588-6, pages 246 and 247.

One embodiment of the invention is a frequency modulation method, in which the frequency of a carrier signal is modulated on the basis of the frequency of a modulation signal, and in which the modulation signal is integrated. The carrier signal can be additionally integrated. A differential signal is formed from the integrated modulation signal and the integrated carrier signal. This differential signal is phase-modulated in order to obtain the frequency-modulated carrier signal as the output signal.

One embodiment includes a frequency modulator, in which, in addition to a first integrator in which the modulation signal is integrated, a further integrator is provided in which the carrier signal is integrated. Provision is made of a comparator in which a differential signal is formed from the integrated modulation signal and the integrated carrier signal. The phase modulator which is known from the prior art and is present is now provided for the purpose of modulating the phase of the differential signal. The frequency-modulated carrier signal is then applied, as the output signal, to the output of the phase modulator.

In one embodiment, it is no longer necessary to frequency-modulate the reference, that is, the crystal oscillator. As a result, the crystal oscillator can be designed for maximum stability in terms of frequency and other parameters. The power consumption of the crystal oscillator can also be minimized. The frequency shift can be set in a flexible manner using the amplitude of the integrated modulation signal.

One embodiment of the invention is suitable for any type of frequency modulation, not only for frequency shift keying (FSK). So-called baseband shaping is also possible in a simple manner.

For the rest, a frequency modulator according to one type mentioned above is distinguished by low outlay, low power consumption, low complexity, the absence of spurs, the transmission of high data rates, high deviation and very good integratability.

Figure 1:
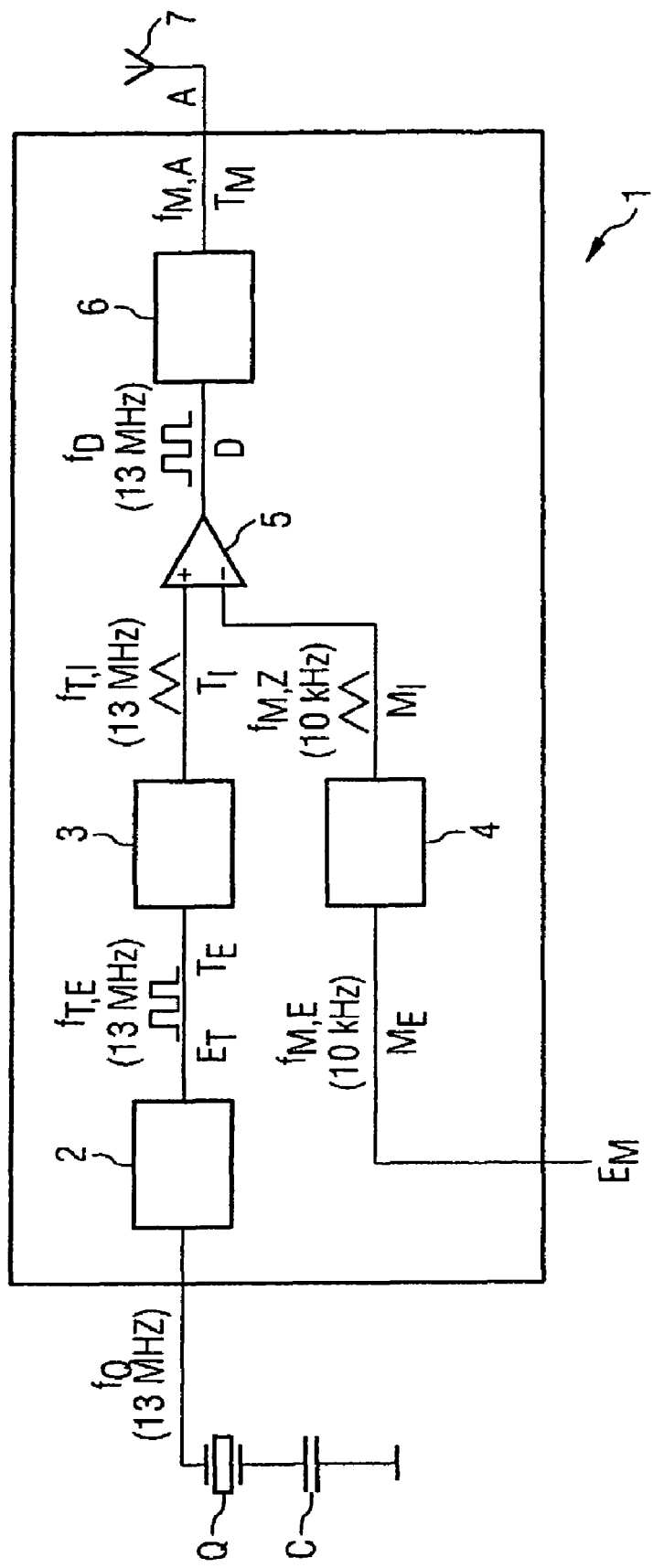
FIG. 1 illustrates a block diagram of a first exemplary embodiment of a frequency modulator according to one embodiment of the invention.

FIG. 1 illustrates a block diagram of a first exemplary embodiment of a frequency modulator 1 according to one embodiment of the invention.

The frequency modulator 1 includes a crystal oscillator 2, two integrators 3 and 4, a comparator 5 and a phase locked loop (PLL) 6.

The input of the crystal oscillator 2 is connected to ground via a series circuit comprising a crystal Q and a capacitor C. The output of the crystal oscillator 2 is connected to the input of the first integrator 3. The output of the latter is connected to the non-inverting input of the comparator 5.

The inverting input of the comparator 5 is connected to the output of the second integrator 4. The output of the comparator 5 is connected to the input of the PLL 6. The output of the phase locked loop 6 forms the output A of the frequency modulator 1 according to one embodiment of the invention, said output A being connected to an antenna 7 for the purpose of transmitting the modulated output signal $T_M$.

In the case of one embodiment of the invention, the crystal oscillator 2 is no longer frequency-modulated as in the case of the frequency modulator illustrated in FIG. 8. One embodiment of the invention is inserted between the crystal oscillator 2 and the PLL 6. Specifically, a comparator 5, which forms the difference between the integrated carrier signal $T_I$ and the integrated data signal $M_I$ and has the phase locked loop 6 connected immediately downstream of it, is provided, according to one embodiment of the invention, between said components—the crystal oscillator 2 and the phase locked loop 6.

In order to describe the operation of the frequency modulator 1 according to one embodiment of the invention, it is assumed that the crystal Q oscillates at a frequency of $f_Q$=13 MHz.

A square-wave voltage signal is therefore applied, as a carrier signal $T_E$ at a carrier frequency of $f_{T,E}$=13 MHz, to the output of the crystal oscillator 2.

It is furthermore assumed that a low-frequency modulation signal $M_E$ at a frequency $f_{M,E}$ and having a square-wave signal amplitude is to be modulated onto the carrier signal $M_E$.

The 13 MHz signal $T_E$ and the 10 kHz data signal $M_E$ are first of all integrated using the integrators 3, 4 and are then supplied to a comparator 5. The output signal D of the comparator 5 is again a 13 MHz signal but the phases of the edges have been modulated. Since the PLL (phase locked loop) reacts to the phase of an edge of the input signal, the PLL 6 accordingly tracks the output frequency $f_{M,A}$.

Figure 2:
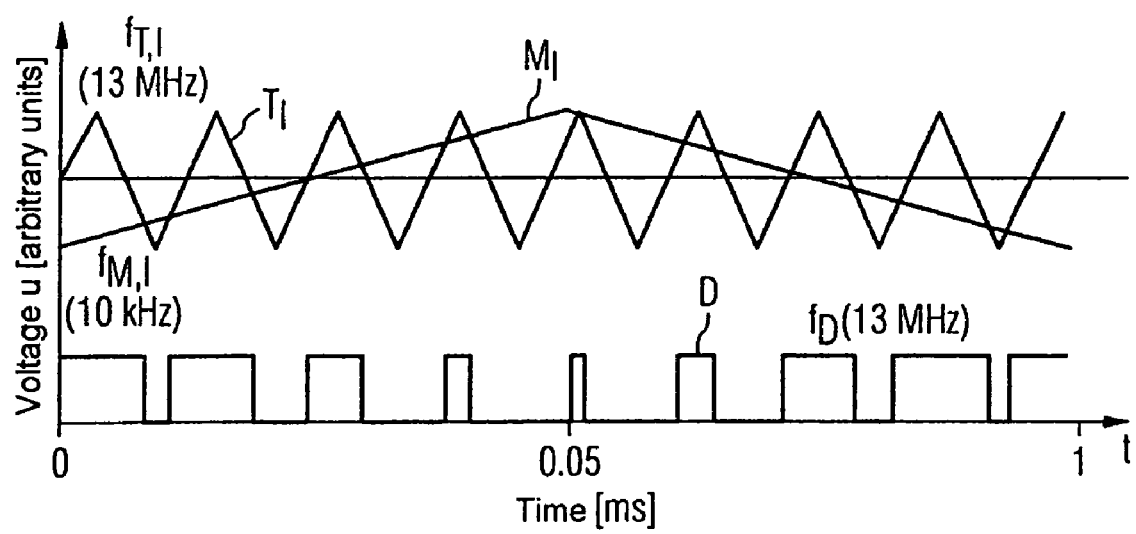
FIG. 2 illustrates input and output signals of a comparator in the frequency modulator according to one embodiment of the invention in FIG. 1.

FIG. 2 outlines the relationships between the signals $T_E$, $M_E$, D at the comparator 5.

The relationship between the angular frequency and phase modulation is as follows:

$$\Delta \omega = \frac{d\varphi}{dt}$$

or converted:

$$d\varphi = \int \Delta \omega \cdot dt$$

This integration is carried out in the integrator 4 for the 10 kHz data signal $M_I$. The comparator 5 then changes the phase or edges of the 13 MHz carrier signal $T_I$. In the case of a sawtooth-waveform integrated carrier signal $T_I$ having a sawtooth amplitude, the maximum phase shift which can be achieved using this type of modulation is $\Delta\varphi_{max}=\pm90°$. From peak to peak, the maximum phase angle is thus $\varphi_{max}=180°$.

This state of affairs will be explained once again below with reference to a numerical example:

An RF output frequency $f_{M,A}$ of 434 MHz with an FSK deviation of $\Delta f_{M,A}=\pm50$ kHz is desired. The PLL 6 has a division factor F of 32. The oscillator's signal must therefore have a frequency $f_{T,E}$ of 13.56 MHz for a quasi deviation $\Delta f_{T,E}$ of ±1.5 kHz.

If the modulation frequency $f_{M,E}$ is 10 kHz, one data bit lasts for 0.05 ms. The phase angle $\varphi$ of the reference $T_E$ must be changed by the value $$\begin{aligned} d\varphi &= \pi \int \Delta f \cdot dt \\ &= 2 * \pi * 1.5k * 0.05 \text{ m} \\ &= 0.47 \text{ rad} \\ &= 27°. \end{aligned}$$

Since the phase shift $\Delta\varphi$ of 27° that is required in this case is less than the maximum permissible phase shift $\Delta\varphi_{max}$ of 180°, the requirement can be realized.

Figure 3:
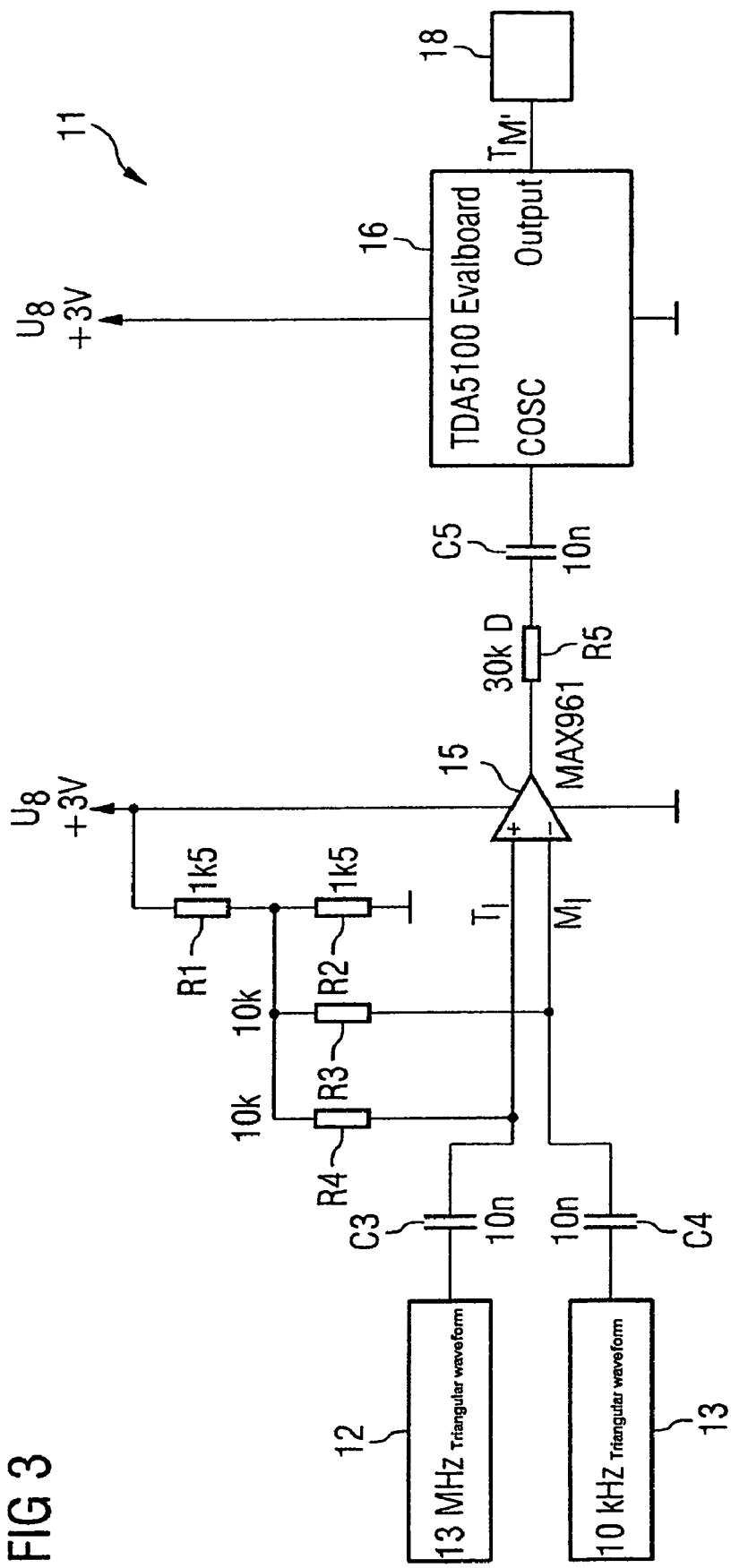
FIG. 3 illustrates a circuit arrangement of a frequency modulator according to one embodiment of the invention.

FIG. 3 illustrates a specific circuit arrangement of a frequency modulator 11 according to one embodiment of the invention that was used to verify the numerical example described above.

For functional testing, the input of the frequency modulator 11 is connected to function generators 12, 13 and the output is connected to a spectrum analyzer 18.

The integration of the carrier signal $T_E$ and of the modulation signal $M_E$ is simulated by the function generators 12, 13.

The core components in this case are a comparator 15 (module MAX961) and a phase locked loop 16 which is connected downstream of the latter and is in the form of the integrated module TDA5100.

Two respective 10 kΩ and 1 k5 Ω resistors R1, R2, R3 and R4 are used to set (in terms of DC) the operating point at the inputs of the comparator 15. Three 10 nF capacitors C3, C4, C5 are used for AC coupling. The 13 MHz generator 12 and the 10 kHz generator 13 provide triangular-waveform voltages. A 30 kΩ resistor R5 at the output of the comparator 15 is used to produce a current source having a current of 100 μA in order to drive the crystal oscillator input COSC of the TDA5100 phase locked loop 16. The output of the evalboard 16 is connected to a spectrum analyzer 18.

Figure 4:
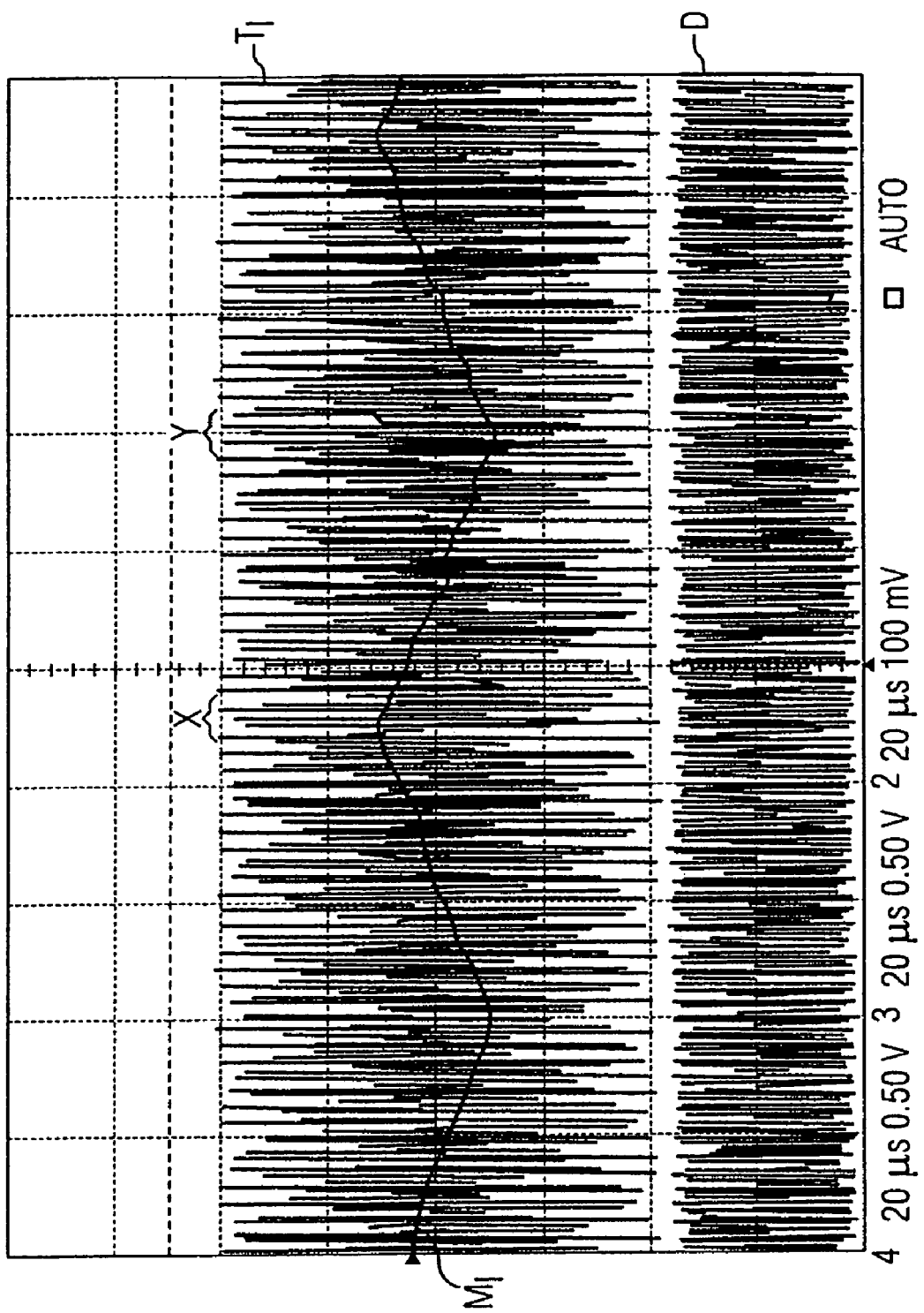
FIG. 4 illustrates input and output signals which are measured at a comparator in the circuit arrangement in FIG. 3.

FIG. 4 reproduces the measured input and output signals, namely the simulated integrated carrier signal $T_I$, the simulated integrated modulation signal $M_I$ and the differential signal D derived therefrom, as a function of time t.

Figure 5:
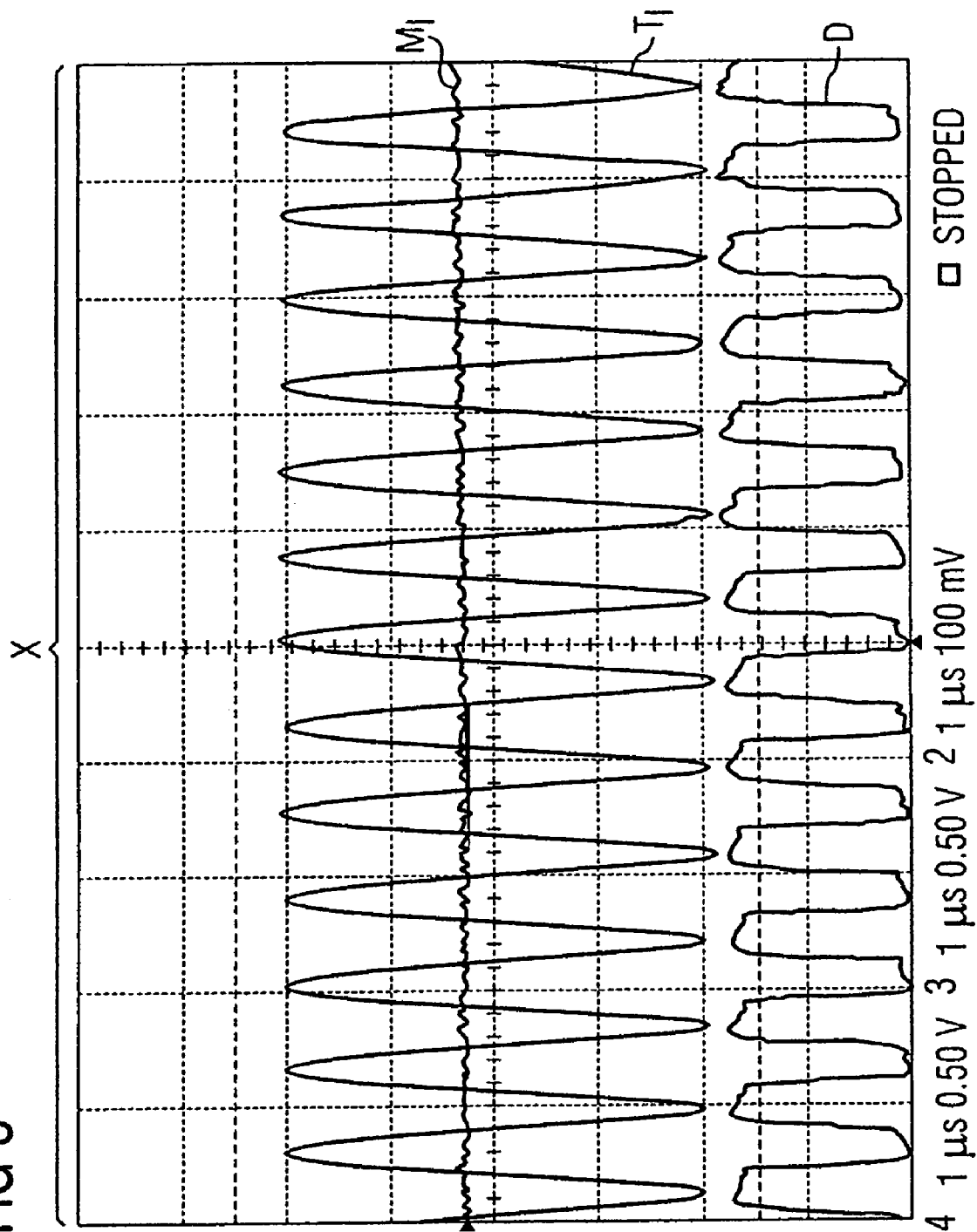
FIG. 5 illustrates a portion X of the measured signals from FIG. 4.
Figure 6:
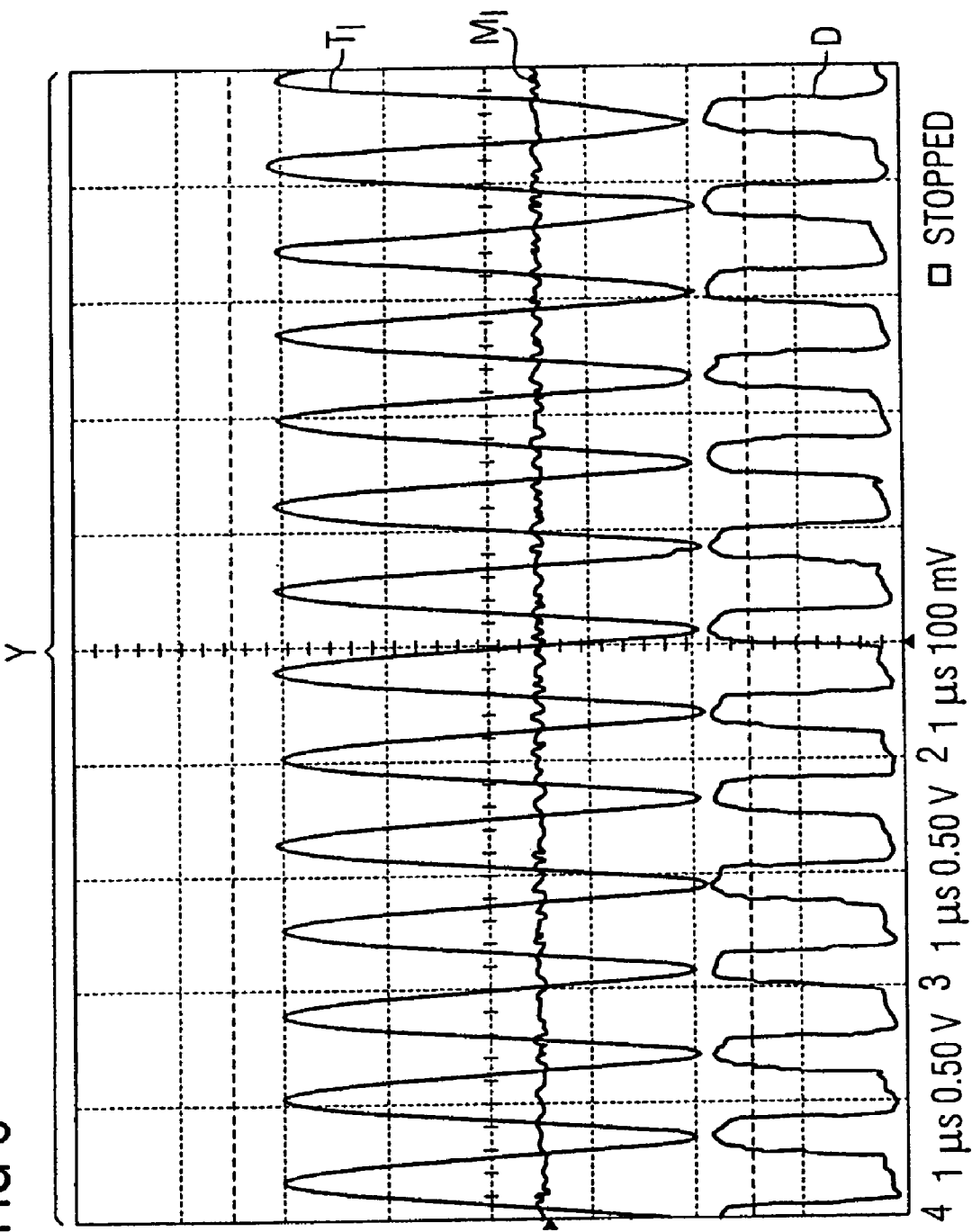
FIG. 6 illustrates another portion Y of the measured signals from FIG. 4.

In order to illustrate the respective signal profile $T_I$, $M_I$ and D, FIGS. 5 and 6 illustrate portions of the diagram illustrated in FIG. 4, on the one hand in the vicinity of the maximum of the modulation signal (FIG. 5) and on the other hand in the vicinity of the minimum of the modulation signal (FIG. 6).

Figure 7:
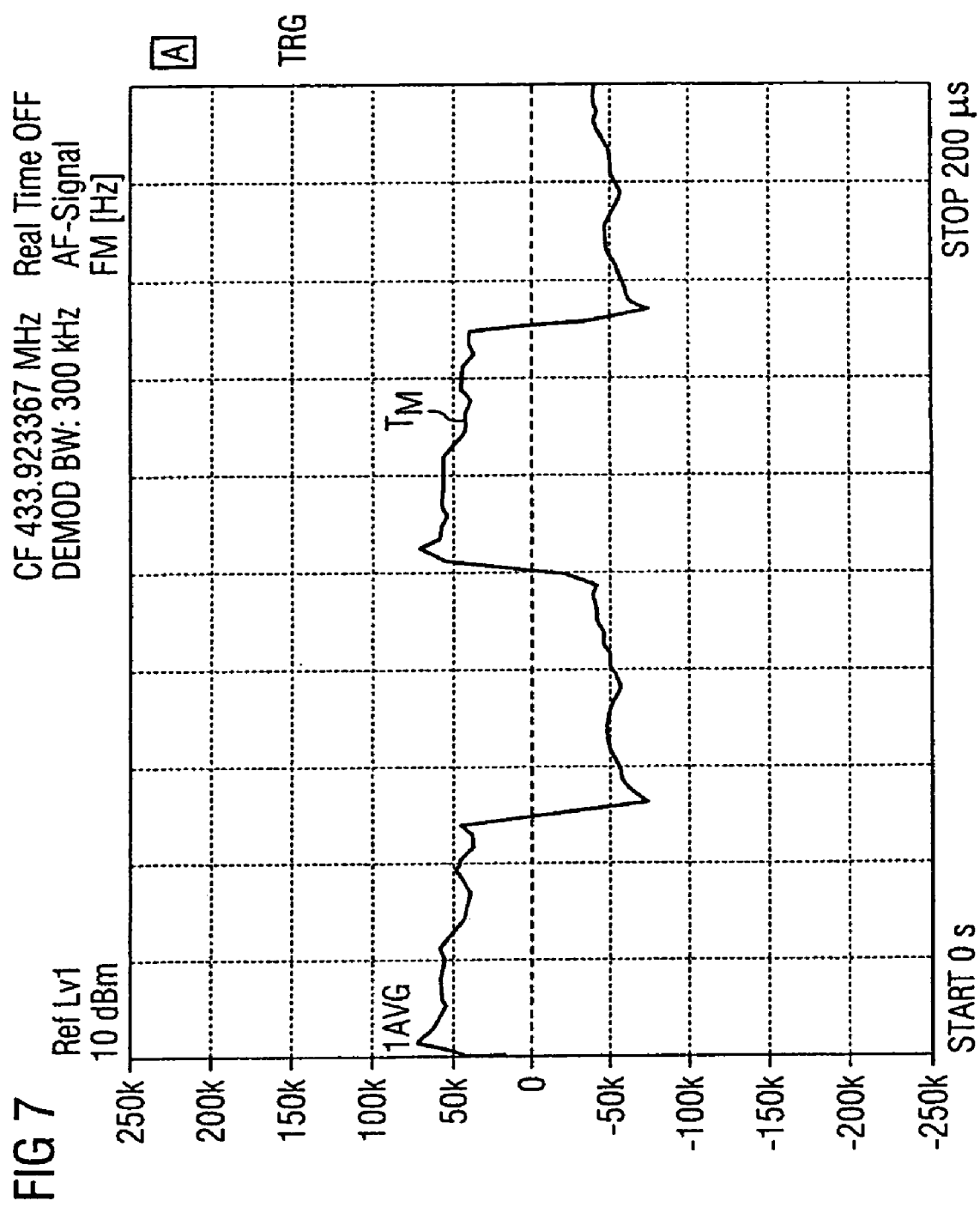
FIG. 7 illustrates the modulated output signal at the output of the frequency modulator illustrated in FIG. 3.

As illustrated in the diagram (illustrated in FIG. 7) provided by the spectrum analyzer having an integrated signal analyzer 18, a radio-frequency output signal $T_M'$ at a frequency $f_{M,A}'$ of 433.92 MHz and having a frequency shift $\Delta f$ of 50 kHz can be tapped off at the output A of the frequency modulator 11.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A frequency modulator for modulating the frequency of a carrier signal on the basis of the frequency of a modulation signal, the frequency modulator comprising:
a first integrator in which the modulation signal is integrated;
a phase modulator;
a second integrator in which the carrier signal is integrated;
a comparator in which a differential signal is formed from the integrated modulation signal and the integrated carrier signal; and
wherein the phase modulator modulates the phase of the differential signal in order to obtain the frequency-modulated carrier signal as an output signal.

2. The frequency modulator of claim 1, wherein the phase modulator is a phase locked loop.

3. The frequency modulator of claim 1, wherein the frequency-modulated carrier signal is divided by a division factor in order to obtain a modulated carrier signal after frequency division.

4. The frequency modulator of claim 1, wherein the modulation signal is free from DC voltage.

5. The frequency modulator of claim 1, wherein a modulation index is formed from a quotient of a frequency shift and the modulation frequency.

6. The frequency modulator of claim 5, wherein the modulation index is one.

7. The frequency modulator of claim 5, wherein the modulation index is less than one.

8. A frequency modulation method comprising:
modulating the frequency of a carrier signal on the basis of the frequency of a modulation signal;
integrating the modulation signal;
integrating the carrier signal;
forming a differential signal from the integrated modulation signal and the integrated carrier signal; and
phase-modulating the differential signal in order to obtain the frequency-modulated carrier signal as an output signal.

9. The method of claim 8, further including dividing the frequency-modulated carrier signal by a division factor in order to obtain a modulated carrier signal after frequency division.

10. The method of claim 8, further including providing the modulation signal free from DC voltage.

11. The method of claims 8, further including forming a modulation index from a quotient of a frequency shift and the modulation frequency.

12. The method of claim 11, further including forming the modulation index such that it is less than one.

13. The method of claim 11, further including forming the modulation index such that it is one.

14. A frequency modulator comprising:
a first integrator in which a modulation signal having a frequency is integrated;
a second integrator in which a carrier signal having a frequency is integrated;
means for forming a differential signal from the integrated modulation signal and the integrated carrier signal; and
means for modulating the phase of the differential signal in order to obtain a frequency-modulated carrier signal as an output signal.

15. The frequency modulator of claim 14, further including a phase modulator that is a phase locked loop.

16. The frequency modulator of claim 1, wherein the frequency-modulated carrier signal is divided by a division factor in order to obtain a modulated carrier signal after frequency division.

17. The frequency modulator of claim 1, wherein the modulation signal is free from DC voltage.

18. The frequency modulator of claim 1, wherein a modulation index is formed from a quotient of a frequency shift and the modulation frequency.

19. The frequency modulator of claim 5, wherein the modulation index is one.

20. The frequency modulator of claim 5, wherein the modulation index is less than one.

* * * * *